(12) United States Patent
Edwards et al.

(10) Patent No.: US 10,679,607 B1
(45) Date of Patent: *Jun. 9, 2020

(54) UPDATING A SPEECH GENERATION SETTING BASED ON USER SPEECH

(71) Applicant: Capital One Services, LLC, McLean, VA (US)

(72) Inventors: Joshua Edwards, Philadelphia, PA (US); Michael Mossoba, Arlington, VA (US); Abdelkadar M'Hamed Benkreira, Washington, DC (US); Alexandra Colevas, Arlington, VA (US)

(73) Assignee: Capital One Services, LLC, McLean, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/577,126

(22) Filed: Sep. 20, 2019

Related U.S. Application Data

(63) Continuation of application No. 16/268,937, filed on Feb. 6, 2019, now Pat. No. 10,468,014.

(51) Int. Cl.
*G10L 15/22* (2006.01)
*G10L 13/033* (2013.01)
*G10L 15/07* (2013.01)
*G06F 3/16* (2006.01)

(52) U.S. Cl.
CPC ............ *G10L 13/033* (2013.01); *G06F 3/167* (2013.01); *G10L 15/07* (2013.01); *G10L 15/22* (2013.01)

(58) Field of Classification Search
CPC ........................................................ G10L 15/22
See application file for complete search history.

(56) References Cited

U.S. PATENT DOCUMENTS

| 5,825,854 A | 10/1998 | Larson et al. |
| 8,370,127 B2 | 2/2013 | Jan et al. |
| 8,473,279 B2 * | 6/2013 | Al-Shammari ....... G06F 40/268 704/9 |
| 8,781,082 B1 | 7/2014 | Wilson |
| 2004/0176953 A1 * | 9/2004 | Coyle ..................... G10L 15/22 704/253 |

(Continued)

FOREIGN PATENT DOCUMENTS

| JP | 3681145 B2 * | 8/2005 |
| JP | 3681145 B2 | 8/2005 |

OTHER PUBLICATIONS

Co-pending U.S. Appl. No. 16/268,937, filed Feb. 6, 2019.

*Primary Examiner* — Feng-Tzer Tzeng
(74) *Attorney, Agent, or Firm* — Harrity & Harrity, LLP

(57) ABSTRACT

A device causes a communication session to be established between the device and a user device to allow the device and the user device to communicate speech, and receives user speech from the user device. The device processes the user speech using a natural language processing technique to determine a plurality of characteristics of the user speech, and updates a speech generation setting of a plurality of speech generation settings based on the plurality of characteristics of the user speech. The device generates, after updating the speech generation setting, device speech using a text-to-speech technique based on the speech generation setting, and sends the device speech to the user device.

20 Claims, 9 Drawing Sheets

(56) References Cited

U.S. PATENT DOCUMENTS

2014/0278420 A1* 9/2014 Meloney ............... G10L 15/063
                                                                       704/249
2016/0240191 A1* 8/2016 Duffield ............... G10L 15/187
2018/0144746 A1* 5/2018 Mishra ................. G10L 25/63

* cited by examiner

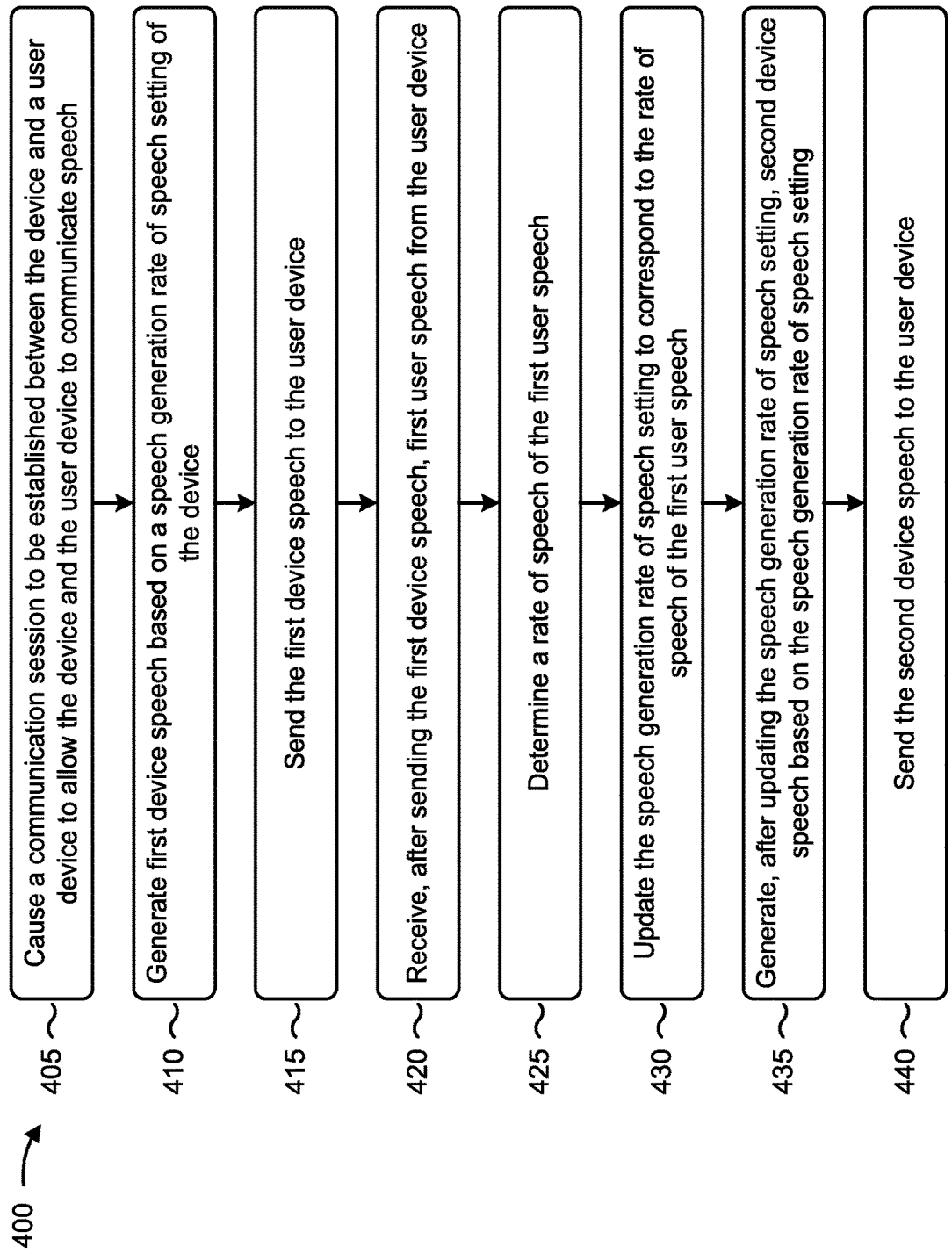

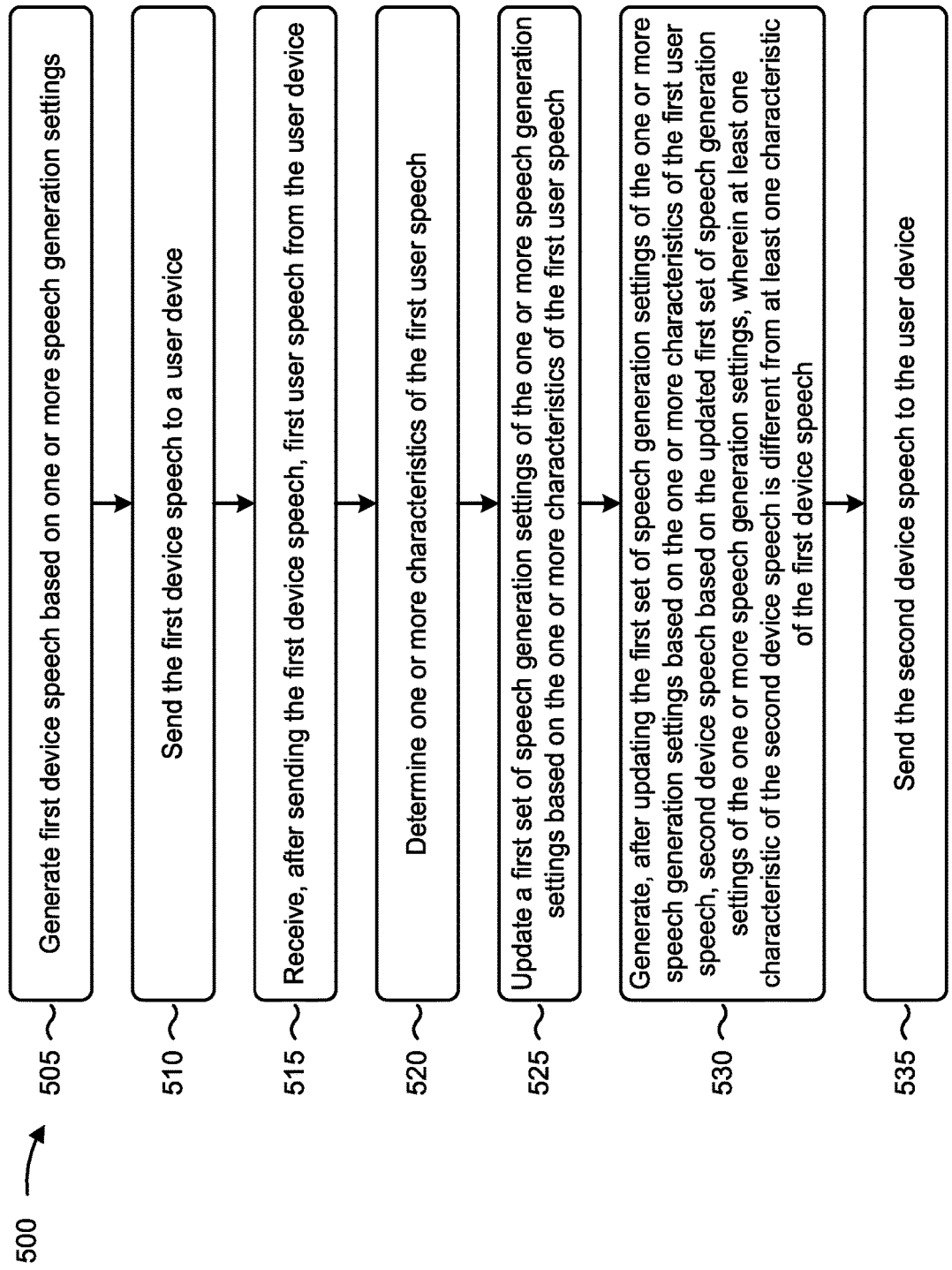

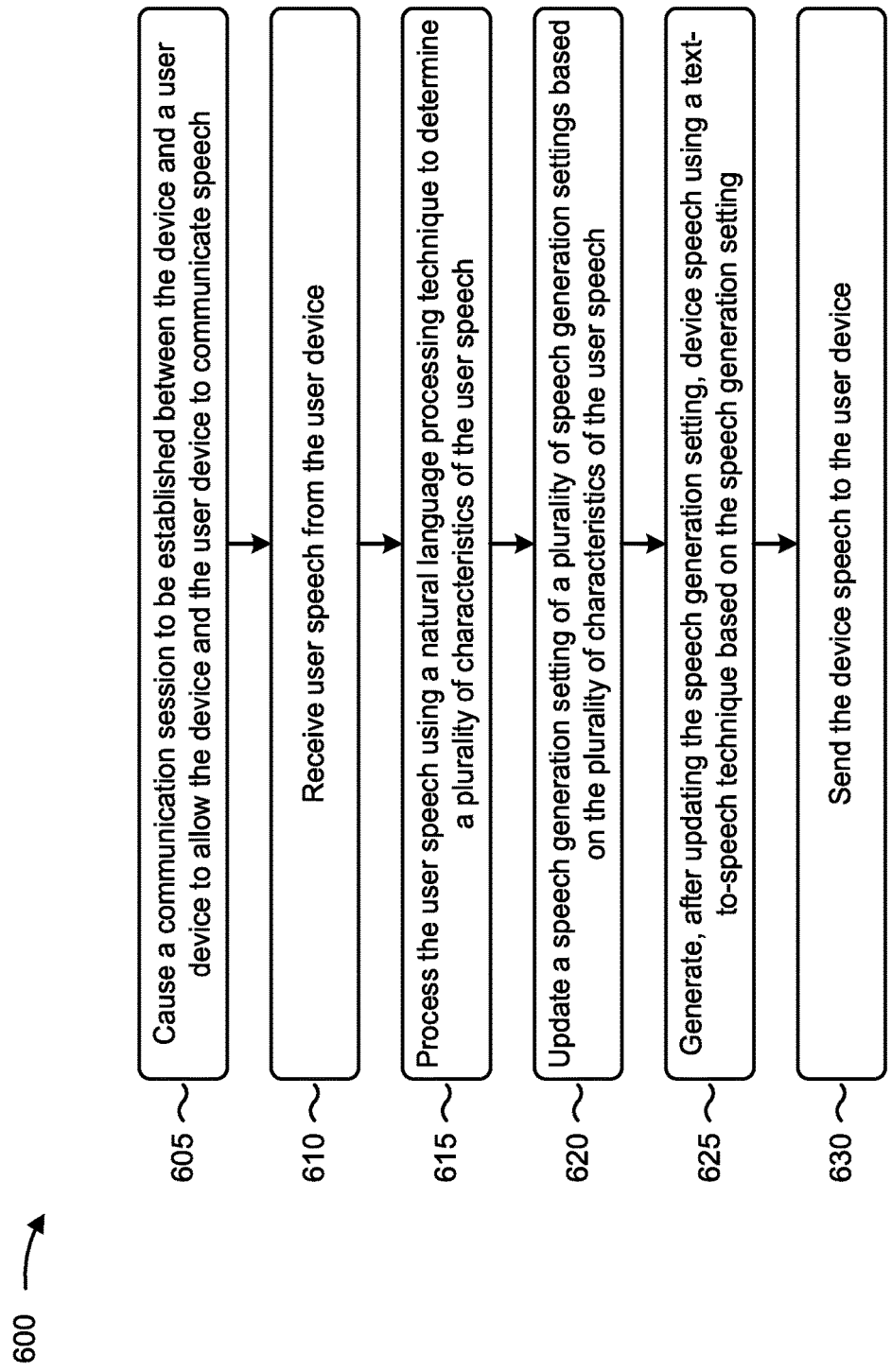

UPDATING A SPEECH GENERATION SETTING BASED ON USER SPEECH

RELATED APPLICATION

This application is a continuation of U.S. patent application Ser. No. 16/268,937, filed Feb. 6, 2019, the content of which is incorporated by reference herein in its entirety.

BACKGROUND

A user can call, via a user device, a telephone number of an organization to interact with an interactive voice response system (IVR) of the organization. The IVR may use one or more speech generation settings to generate speech to communicate to the user device.

SUMMARY

According to some implementations, a device may include one or more memories, and one or more processors, communicatively coupled to the one or more memories, to cause a communication session to be established between the device and a user device to allow the device and the user device to communicate speech. The one or more processors may generate first device speech based on a speech generation rate of speech setting of the device, and send the first device speech to the user device. The one or more processors may receive, after sending the first device speech, first user speech from the user device, and determine a rate of speech of the first user speech. The one or more processors may update the speech generation rate of speech setting to correspond to the rate of speech of the first user speech. The one or more processors may generate, after updating the speech generation rate of speech setting, second device speech based on the speech generation rate of speech setting, and send the second device speech to the user device.

According to some implementations, a method may include generating, by a device, first device speech based on one or more speech generation settings, and sending, by the device, the first device speech to a user device. The method may include receiving, by the device after sending the first device speech, first user speech from the user device, and determining, by the device, one or more characteristics of the first user speech. The method may include updating, by the device, a first set of speech generation settings of the one or more speech generation settings based on the one or more characteristics of the first user speech. The method may include generating, by the device and after updating the first set of speech generation settings of the one or more speech generation settings based on the one or more characteristics of the first user speech, second device speech based on the updated first set of speech generation settings of the one or more speech generation settings, wherein at least one characteristic of the second device speech is different from at least one characteristic of the first device speech. The method may include sending, by the device, the second device speech to the user device.

According to some implementations, a non-transitory computer-readable medium may store one or more instructions that, when executed by one or more processors of a device, cause the one or more processors to cause a communication session to be established between the device and a user device to allow the device and the user device to communicate speech, and receive user speech from the user device. The one or more instructions may cause the one or more processors to process the user speech using a natural language processing technique to determine a plurality of characteristics of the user speech, and update at least one speech generation setting of a plurality of speech generation settings based on the plurality of characteristics of the user speech. The one or more instructions may cause the one or more processors to generate, after updating the at least one speech generation setting, device speech using a text-to-speech technique based on the at least one speech generation setting, and send the device speech to the user device.

BRIEF DESCRIPTION OF THE DRAWINGS

FIGS. 4-6 are flow charts of example processes for updating a speech generation setting based on user speech.

DETAILED DESCRIPTION

Figure 1A:
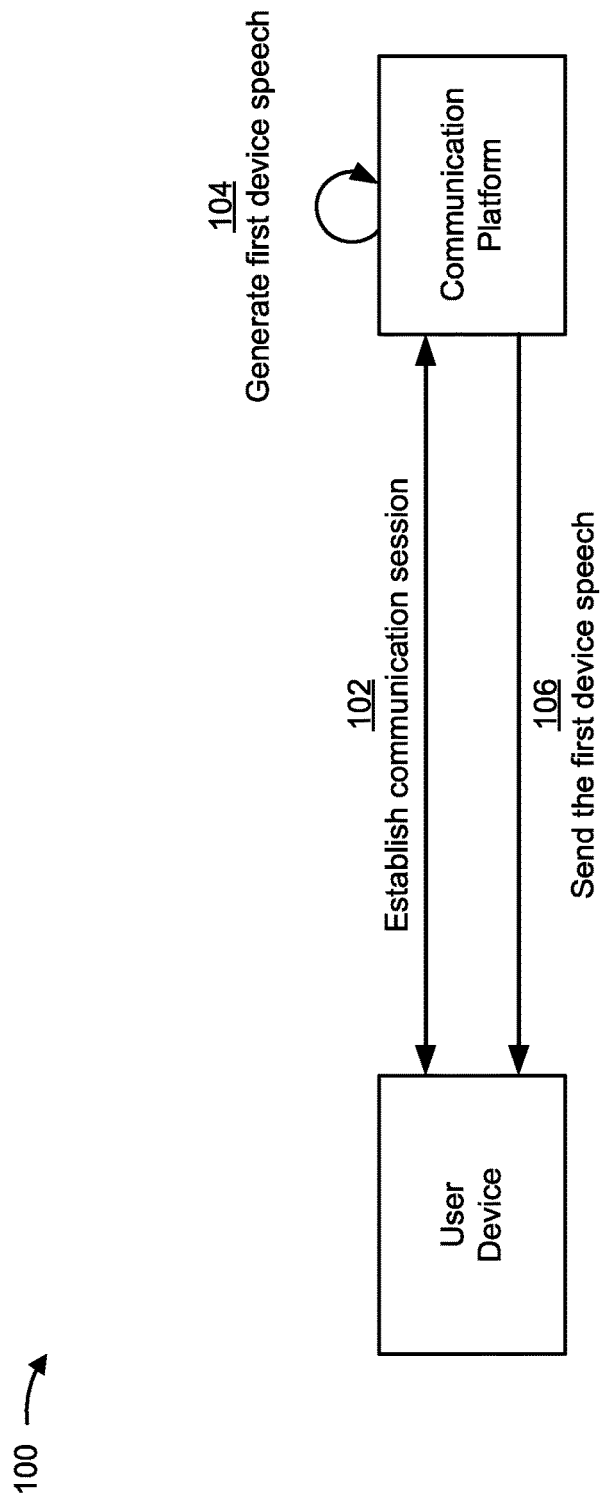
FIGS. 1A-1D are diagrams of example implementations described herein.

The following detailed description of example implementations refers to the accompanying drawings. The same reference numbers in different drawings may identify the same or similar elements.

In some instances, a user calls, via a user device, a telephone number of an organization to interact with an interactive voice response system (IVR) of a communication platform. In some cases, the user interacts, via the user device, with the IVR to obtain information (e.g., determine a balance of a financial account) and/or to cause an action to be performed (e.g., transfer money between financial accounts). In some cases, the IVR may interact with the user by generating and sending device speech to the user device via a communication session. However, the device speech may have one or more characteristics that annoy, frustrate, and/or offend the user. For example, the user may find that a rate of speech of the device speech is too fast or too slow, a loudness of the device speech is too loud or too quiet, a language of the device speech is incomprehensible, an accent of the device speech is irritating, and/or the like.

This may increase a likelihood that the user will terminate the communication session (e.g., hang up the call) while the user is interacting with the IVR. This may cause the user to call the organization one or more additional times to try to avoid interacting with IVR (e.g., attempt to communicate with a customer service representative of the organization). This may unnecessarily consume resources (e.g., memory resources, power resources, communication resources, and/or the like), such as user device resources, network resources, and communication platform resources to support the user placing multiple calls. Moreover, the user device resources, the network resources, and the communication platform resources may be unnecessarily used to facilitate a call that will ultimately be terminated before the user accomplishes the goal of the call.

According to some implementations described herein, a communication platform causes a communication session to be established between the communication platform and a user device to allow the device and the user device to communicate speech. In some implementations, the communication platform generates first device speech based on one or more speech generation settings of the communication platform and sends the first device speech to the user device. In some implementations, the communication platform receives, after sending the first device speech, first user speech from the user device, and determines one or more characteristics of the first user speech. In some implementations, the communication platform updates at least one speech generation setting, of the one or more speech generation settings, to correspond to at least one characteristic, of the one or more characteristics, of the first user speech. In some implementations, the communication platform generates, after updating the at least one speech generation setting, second device speech based on the at least one speech generation setting, and sends the second device speech to the user device.

In this way, the communication platform reduces a demand for resources (e.g., memory resources, power resources, communication resources, and/or the like), such as user device resources, network resources, communication platform resources, and/or the like. For example, the communication platform may update the at least one speech generation setting to generate device speech that is more pleasing to the user of the user device, which may increase a likelihood that the user will continue interacting with the communication platform and accomplish the user's goal in calling the communication platform. This decreases a likelihood that the user will terminate the communication session and subsequently initiate one or more new communication sessions that consume additional user device resources, network resources, communication platform resources, and/or the like. Moreover, the communication platform may continuously process user speech to update the one or more speech generation settings so that the communication platform continuously generates device speech that pleases the user. This enables the communication platform to be adaptive and generate device speech with characteristics that change as characteristics of the user speech change. This further decreases a likelihood that the user will terminate the communication session and subsequently initiate one or more new communication sessions that consume additional user device resources, network resources, communication platform resources, and/or the like.

FIGS. 1A-1D are diagrams of an example implementation 100 described herein. As shown in FIG. 1A, example implementation 100 may include a user device and/or a communication platform. The user device may be a communication and/or computing device, such as a mobile phone, a smartphone, a laptop computer, a tablet computer, and/or the like. The communication platform may be a computing device, a server, a cloud computing device, and/or the like. The communication platform may be associated with an organization, such as a company, a financial institution, a school, and/or the like.

In some implementations, the user device and the communication platform may communicate via one or more communication sessions. The communication platform may include one or more interactive voice response systems (IVRs), one or more virtual assistants, and/or the like to interact (e.g., send and receive speech) with a user of the user device via the one or more communication sessions. Some example implementations described herein concern a single user device and/or communication platform, but implementations may include a plurality of user devices and/or communication platforms. In some implementations, the user device and/or the communication platform may be connected via a network, such as the internet, an intranet, and/or the like.

In some implementations, the user device may send a communication request to the communication platform. The communication request may be a request for a communication session to be established between the user device and the communication platform. In some implementations, the user may interact, via a user interface of the user device, with an application and/or a program running on the user device to cause the user device to generate and send the communication request. For example, the user may enter a telephone number associated with the organization, via the user interface, into the user device to cause the user device to call the telephone number. In some implementations, the user device may send the communication request to the communication platform and/or the communication platform may obtain the communication request from the user device.

As shown in FIG. 1A and by reference number 102, the communication platform may cause a communication session to be established between the user device and the communication platform. For example, the communication platform may establish the communication session with the user device based on receiving the communication request. As another example, the communication platform may generate a communication response, based on the communication request, and send the communication response to a different device, such as a server device, to cause the different device to establish the communication session between the user device and the communication platform. In some implementations, the user device, the different device, and/or the like may cause the communication session to be established between the user device and the communication platform.

In some implementations, the user device and the communication platform may communicate (e.g., communicate speech) via the communication session. As shown by reference number 104, the communication platform may generate first device speech. For example, the communication platform may use an IVR, of the one or more IVRs, a virtual assistant, of the one or more virtual assistants, and/or the like to generate the first device speech. In some implementations, the communication platform may generate the first device speech based on a menu tree of the communication platform. For example, the communication platform (e.g., using the IVR, the virtual assistant, and/or the like) may generate a prompt concerning a menu of the menu tree.

In some implementations, the communication platform may generate the first speech using one or more speech generation settings of the communication platform, such as a speech generation rate of speech setting, a speech generation cadence setting, a speech generation loudness setting, a speech generation timbre setting, a speech generation language setting, a speech generation dialect setting, a speech generation accent setting, a speech generation grammar setting, and/or the like. In some implementations, the communication platform may determine at least one speech generation setting, of the one or more speech generation settings, and generate the first device speech based on the at least one speech generation setting. For example, the communication platform may generate the first device speech based on the speech generation rate of speech setting, the speech generation language setting, and/or the speech generation accent setting.

As shown by reference number 106, the communication platform may send the first device speech to the user device (e.g., via the communication session) and/or the user device may obtain the first device speech from the communication platform. The user device, after receiving the first device speech, may present (e.g., using a speaker of the user device) the first device speech to the user.

Figure 1B:
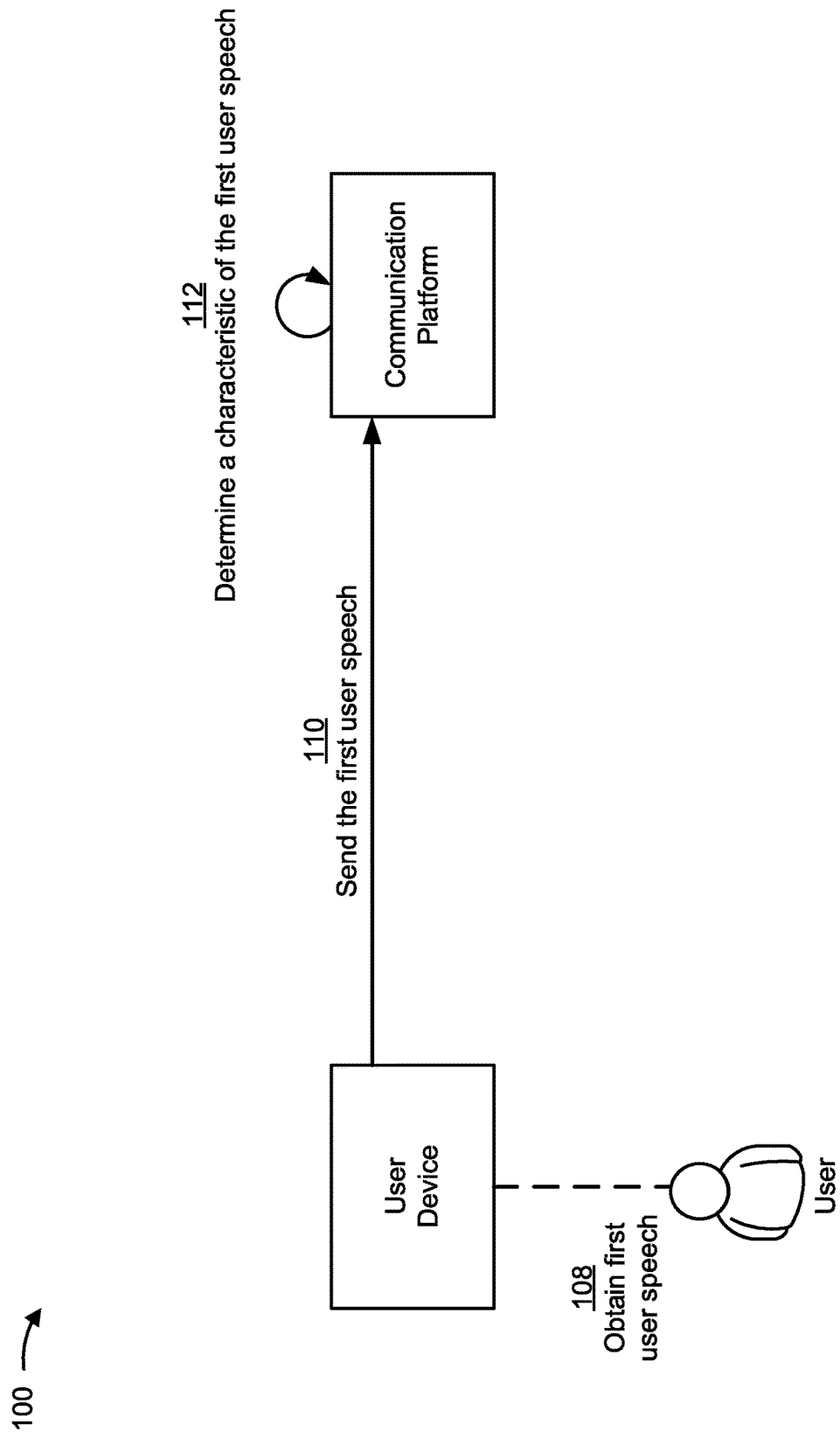

As shown in FIG. 1B and by reference number 108, the user device may obtain first user speech of the user. The user may utter the first user speech and the user device may obtain the first user speech (e.g., using a microphone of the user device). The user may utter the first user speech in response to the first device speech. As shown by reference number 110, the user device may send the first user speech to the communication platform (e.g., via the communication session) and/or the communication platform may obtain the first user speech from the user device.

As shown by reference number 112, the communication platform may determine one or more characteristics of the first user speech, such as a rate of speech of the first user speech, a cadence of the first user speech, a loudness of the first user speech, a timbre of the first user speech, a language associated with the first user speech, a dialect associated with the first user speech, an accent associated with the first user speech, a grammar associated with the first user speech, and/or the like. The communication platform may process the first user speech using a natural language processing technique to determine the one or more characteristics of the first user speech.

For example, the communication platform may process the first user speech using a natural language processing technique to determine one or more words of the first user speech and may determine a start time and an end time of the first user speech. The communication platform may determine a number of words of the first user speech, based on the one or more words, and a length of time of the first user speech, based on the start time and the end time of the first user speech, to determine the rate of speech of the first user speech. Additionally, or alternatively, the communication platform may process the first user speech to determine a number of syllables of the first user speech and length of time of the first user speech to facilitate determining the rate of speech of the first user speech.

In some implementations, the communication platform may pre-process the first user speech to facilitate determining the one or more characteristics of the first user speech. For example, the communication platform may process the first user speech to remove filler words, pauses between phrases and/or sentences, background noise, and/or the like.

Figure 1C:
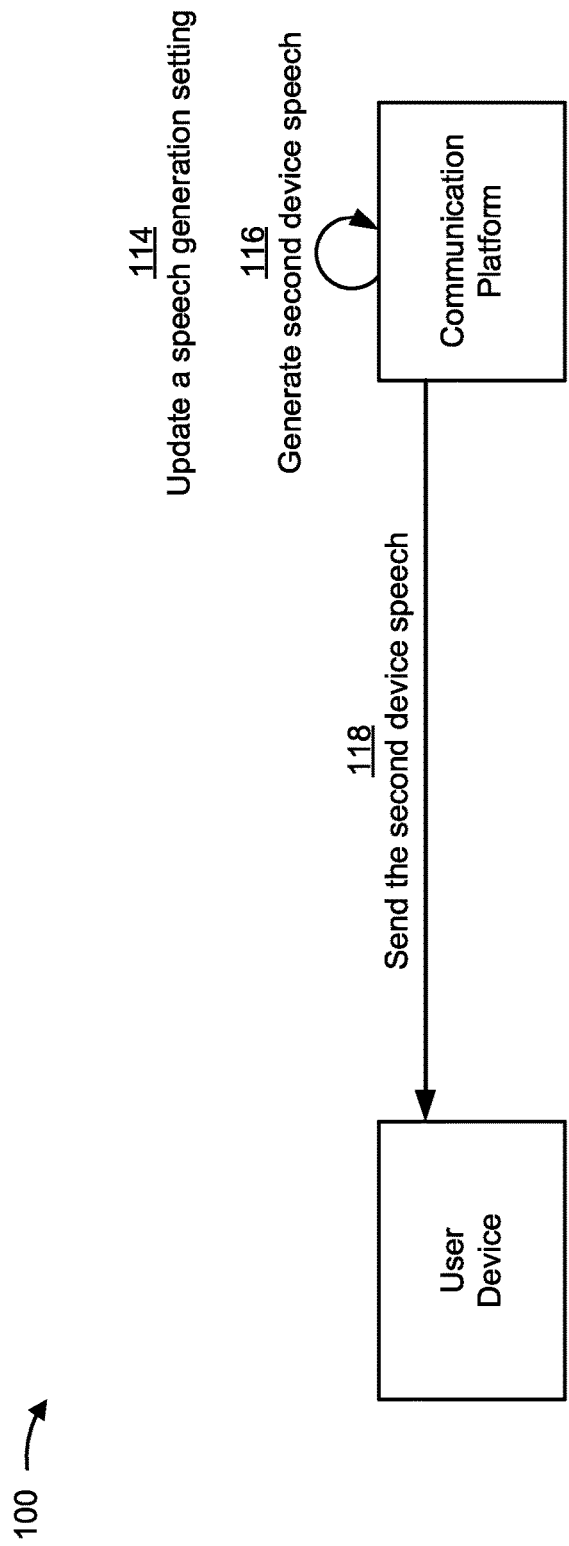

As shown in FIG. 1C and by reference number 114, the communication platform may update at least one speech generation setting, of the one or more speech generation settings, based on at least one characteristic, of the one or more characteristics, of the first user speech. In some implementations, the communication platform may update the at least one speech generation setting to correspond to the at least one characteristic of the first user speech.

For example, the communication platform may update the speech generation rate of speech setting to correspond to the rate of speech of the first user speech. In another example, the communication platform may update the speech generation language setting, of the one or more speech generation settings, to correspond to the language associated with the first user speech. In an additional example, the communication platform may update the speech generation accent setting, of the one or more speech generation settings, to correspond to the accent associated with the first user speech. As another example, the communication platform may update the speech generation cadence setting, of the one or more speech generation settings, to correspond to the cadence associated with the first user speech. In an additional example, the communication platform may update the speech generation grammar setting, of the one or more speech generation settings, to correspond to the grammar associated with the first user speech.

In some implementations, updating the at least one speech generation setting to correspond to the at least one characteristic of the first user speech may mean updating the at least one speech generation setting to match the at least one characteristic of the first user speech; to match, within a threshold distance, the at least one characteristic of the first user speech; to match the at least one characteristic of the first user speech within a category; to correspond to the at least one characteristic of the first user speech according to a relationship (e.g., a relationship that is linear, nonlinear, exponential, inverse, and/or the like); and/or the like. For example, the communication platform may update the speech generation language setting to match the language associated with the first user speech (e.g., update the speech generation language to Spanish when the language associated with the first user speech is Spanish) and/or match the language associated with the first user speech with a category (e.g., update the speech generation language to Cantonese when the language associated with the first user speech is Cantonese). As another example, the user may update the speech generation rate of speech stetting to match, within a threshold distance (e.g., within ten words per minute), the rate of speech associated with the first user speech and/or to correspond to the rate of speech associated with the first user speech according to a relationship (e.g., 70% of the rate of speech associated with the first user speech).

In some implementations, the communication platform may determine a relationship between one or more particular speech generation settings, of the one or more speech generation settings, and one or more particular characteristics of user speech. In some implementations, the communication platform may use a machine learning model to determine the relationship between the one or more particular speech generation settings and the one or more particular characteristics of user speech (hereinafter, the "relationship"). In some implementations, the communication platform may generate and/or train the machine learning model. For example, the communication platform may obtain historical data associated with speech generation settings and characteristics of user speech (hereinafter referred to as the "historical data") to generate and/or train the machine learning model. In some implementations, the communication platform may process the historical data to train the machine learning model to determine the relationship.

In some implementations, the communication platform may perform a set of data manipulation procedures to process the historical data to generate the machine learning model, such as a data preprocessing procedure, a model training procedure, a model verification procedure, and/or the like. For example, the communication platform may preprocess the historical data to remove filler words, pauses between phrases and/or sentences, background noise, confidential data, and/or the like. In this way, the communication platform may organize thousands, millions, or billions of data entries for machine learning and model generation.

In some implementations, the communication platform may perform a training operation when generating the machine learning model. For example, the communication platform may portion the historical data into a training set, a validation set, a test set, and/or the like. In some implementations, a minimum feature set may be created from pre-processing and/or dimensionality reduction of the historical data. In some implementations, the communication platform may train the machine learning model on this minimum feature set, thereby reducing processing required to train the machine learning model, and may apply a classification technique to the minimum feature set.

In some implementations, the communication platform may use a classification technique, such as a logistic regression classification technique, a random forest classification technique, a gradient boosting machine (GBM) classifier technique, and/or the like to determine a categorical outcome (e.g., that one or more particular speech generation settings are associated with one or more particular characteristics of user speech). Additionally, or alternatively, the communication platform may perform a recursive feature elimination procedure to split the data of the minimum feature set into partitions and/or branches, and use the partitions and/or branches to perform predictions (e.g., that one or more particular speech generation settings are associated with one or more particular characteristics of user speech). Based on using the recursive feature elimination procedure, the communication platform may reduce utilization of computing resources relative to manual, linear sorting and analysis of data points, thereby enabling use of thousands, millions, or billions of data points to train the machine learning model, which may result in a more accurate machine learning model than using fewer data points.

Additionally, or alternatively, the communication platform may use a support vector machine (SVM) classifier technique to generate a non-linear boundary between data points in the training set. In this case, the non-linear boundary is used to classify test data (e.g., one or more particular speech generation settings) into a particular class (e.g., a class indicating that the one or more particular speech generation settings are associated with one or more particular characteristics of user speech).

Additionally, or alternatively, the communication platform may train the machine learning model using a supervised training procedure that includes receiving input to the model from a subject matter expert, which may reduce an amount of time, an amount of processing resources, and/or the like to train the machine learning model relative to an unsupervised training procedure. In some implementations, the communication platform may use one or more other model training techniques, such as a neural network technique, a latent semantic indexing technique, and/or the like. For example, the communication platform may perform an artificial neural network processing technique (e.g., using a two-layer feedforward neural network architecture, a three-layer feedforward neural network architecture, and/or the like) to perform pattern recognition with regard to patterns of one or more particular speech generation settings associated with one or more particular characteristics of user speech. In this case, using the artificial neural network processing technique may improve an accuracy of the machine learning model generated by the communication platform by being more robust to noisy, imprecise, or incomplete data, and by enabling the communication platform to detect patterns and/or trends undetectable to human analysts or systems using less complex techniques.

In some implementations, a different device, such as a server device, may generate and train the machine learning model. The different device may send the machine learning model to the communication platform. The different device may update and send (e.g., on a scheduled basis, on an on-demand basis, on a triggered basis, and/or the like) the machine learning model to the communication platform.

in this way, the communication platform may use artificial intelligence techniques, machine learning techniques, deep learning techniques, and/or the like to determine the relationship between one or more speech generation settings and one or more characteristics of user speech.

Accordingly, the communication platform may process the at least one characteristic of the first user speech using the machine learning model to determine a relationship between the at least one characteristic of the first user speech and the at least one speech generation setting, and may update the at least one speech generation setting based on the relationship. For example, the communication platform may determine a relationship between a speech generation rate of speech setting and a rate of speech of user speech and update the speech generation rate of speech setting to correspond to the rate of speech of the first user speech based on the relationship.

As shown by reference number 116, the communication platform may generate second device speech (e.g., using a text-to-speech technique) based on the one or more speech generation settings (e.g., after updating the at least one speech generation setting). In some implementations, the communication platform may generate second device speech content based on the first user speech and generate the second device speech based on the second device speech content. For example, the communication platform may process the first user speech using a natural language processing technique to determine first user speech content. The communication platform may generate the second device speech content based on the first user speech content and may generate the second device speech (e.g., using a speech generation technique that uses the one or more speech generation settings) based on the second device speech content. In some implementations, the communication platform may generate the second device speech based on the menu tree of the communication platform. For example, when the first user speech content indicates a selection concerning a menu of the menu tree, the communication platform may generate a prompt concerning an additional menu of the menu tree associated with the selection.

In some implementations, at least one characteristic of the second device speech may correspond to the at least one speech generation setting. For example, a rate of speech and/or a dialect of the second device speech may correspond, respectively, to the speech generation rate of speech setting and/or the speech generation dialect setting. In some implementations, at least one characteristic of the second device speech is different from at least one characteristic (e.g., a corresponding characteristic) of the first device speech. For example, a rate of speech of the second device speech may be different than a rate of speech of the first device speech.

As shown by reference number 118, the communication platform may send the second device speech to the user device (e.g., via the communication session) and/or the user device may obtain the second device speech from the communication platform. The user device, after receiving the second device speech, may present (e.g., using the speaker of the user device) the second device speech to the user.

Figure 1D:
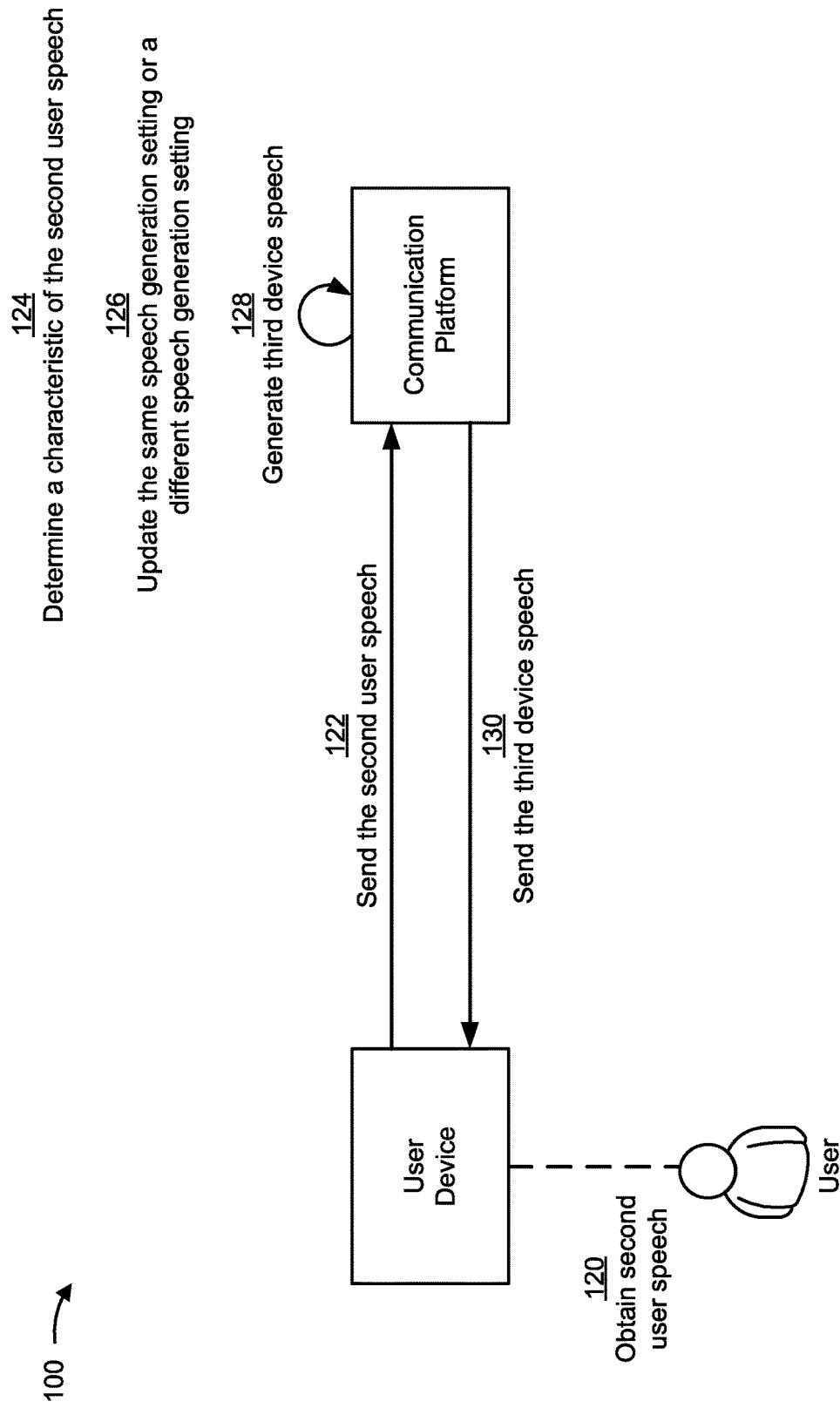

As shown in FIG. 1D and by reference number 120, the user device may obtain second user speech of the user in a similar manner as described herein in relation to FIG. 1B. For example, the user may utter the second user speech and the user device may obtain the second user speech (e.g., using the microphone of the user device). The user may utter the second user speech in response to the second device speech. As shown by reference number 122, the user device may send the second user speech to the communication platform (e.g., via the communication session) and/or the communication platform may obtain the second user speech from the user device in a similar manner as described herein in relation to FIG. 1B.

As shown by reference number 124, the communication platform may determine one or more characteristics of the second user speech in a similar manner as described herein in relation to FIG. 1B. For example, the communication platform may process the second user speech using a natural language processing technique to determine the one or more characteristics of the second user speech.

As shown by reference number 126, the communication platform may update the at least one speech generation setting and/or an additional at least one speech generation setting, of the one or more speech generation settings, based on at least one characteristic, of the one or more characteristics, of the second user speech in a similar manner as described herein in relation to FIG. 1C. For example, the communication platform may update the at least one speech generation setting and/or the additional at least one speech generation setting to correspond to the at least one characteristic of the second user speech. As another example, the communication platform may process the at least one characteristic of the second user speech using the machine learning model to determine a relationship between the at least one characteristic of the second user speech and the at least one speech generation setting and/or the additional at least one speech generation setting, and may update the at least one speech generation setting and/or the additional at least one speech generation setting based on the relationship. In this way the communication platform may, based on the second user speech, update the same speech settings, some of the same speech settings, and/or different speech settings that were updated by the communication platform based on the first user speech.

As shown by reference number 128, the communication platform may generate third device speech based on the one or more speech generation settings (e.g., after updating the at least one speech generation setting and/or the additional at least one speech generation setting) in a similar manner as described herein in relation to FIG. 1C. In some implementations, at least one characteristic of the third device speech may correspond to the at least one speech generation setting and/or the additional at least one speech generation setting. For example, a rate of speech and/or an accent of the third device speech may correspond, respectively, to the speech generation rate of speech setting and/or the speech generation accent setting. In some implementations, at least one characteristic of the third device speech is different from at least one characteristic (e.g., a corresponding characteristic) of the second device speech. For example, a rate of speech of the third device speech may be different than a rate of speech of the second device speech.

As shown by reference number 130, the communication platform may send the third device speech to the user device (e.g., via the communication session) and/or the user device may obtain the third device speech from the communication platform in a similar manner as described herein in relation to FIG. 1C. The user device, after receiving the third device speech, may present (e.g., using the speaker of the user device) the third device speech to the user.

As indicated above, FIGS. 1A-1D are provided merely as an example. Other examples may differ from what is described with regard to FIGS. 1A-1D.

Figure 2:
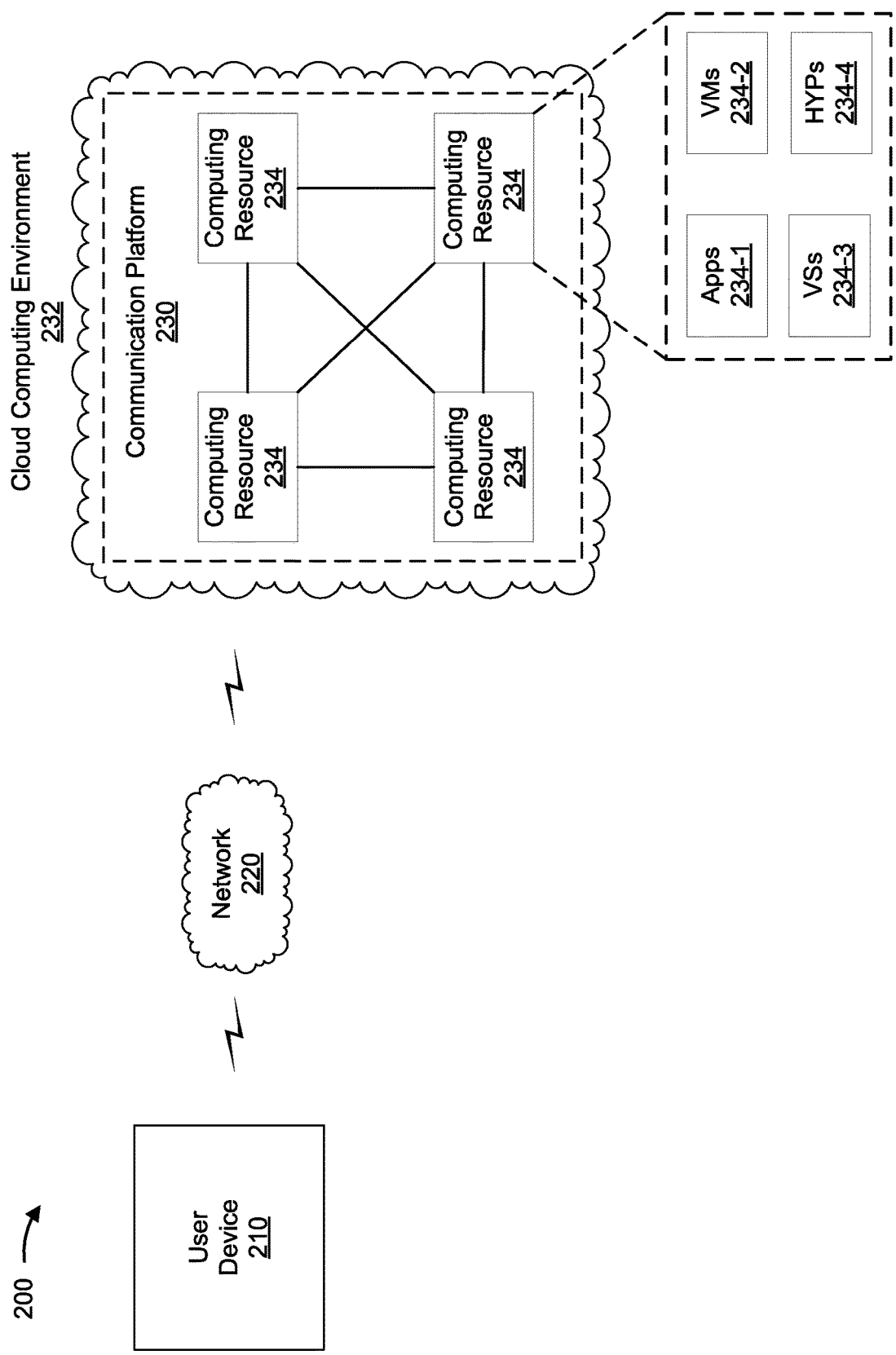
FIG. 2 is a diagram of an example environment in which systems and/or methods described herein may be implemented.

FIG. 2 is a diagram of an example environment 200 in which systems and/or methods described herein may be implemented. As shown in FIG. 2, environment 200 may include a user device 210, a network 220, a communication platform 230 in a cloud computing environment 232 that includes computing resources 234, and/or the like. Devices of environment 200 may interconnect via wired connections, wireless connections, or a combination of wired and wireless connections.

User device 210 includes one or more devices capable of receiving, generating, storing, processing, and/or providing information, such as information described herein. For example, user device 210 may include a computer (e.g., a desktop computer, a laptop computer, a tablet computer, a handheld computer, a server device, etc.), a mobile phone (e.g., a smart phone, a radiotelephone, etc.), an internet of things (IoT) device or smart appliance, or a similar device. In some implementations, user device 210 may receive information from and/or transmit information to communication platform 230, and/or the like.

Network 220 includes one or more wired and/or wireless networks. For example, network 220 may include a cellular network (e.g., a long-term evolution (LTE) network, a code division multiple access (CDMA) network, a 3G network, a 4G network, a 5G network, another type of next generation network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the internet, a fiber optic-based network, a cloud computing network, a mesh network and/or the like, and/or a combination of these or other types of networks.

Communication platform 230 includes one or more devices capable of updating a speech generation setting based on user speech. Communication platform 230 may establish a communication session with user device 210, may generate first device speech, may send the first device speech to user device 210, may receive first user speech from user device 210, may determine a characteristic of the first user speech, and may update a speech generation setting. Additionally, communication platform 230 may generate second device speech, based on the speech generation setting, and may send the second device speech to user device 210, may receive second user speech from user device 210, may determine a characteristic of the second user speech, and may update the same speech generation setting and/or a different speech generation setting. Additionally, communication platform 230 may generate third device speech, based on the same speech generation setting and/or one or more different speech generation settings, and may send the third device speech to user device 210.

In some implementations, communication platform 230 may be designed to be modular such that certain software components may be swapped in or out depending on a particular need. As such, communication platform 230 may be easily and/or quickly reconfigured for different uses. In some implementations, communication platform 230 may receive information from and/or transmit information to user device 210, such as via network 220.

In some implementations, as shown, communication platform 230 may be hosted in a cloud computing environment 232. Notably, while implementations described herein describe communication platform 230 as being hosted in cloud computing environment 232, in some implementations, communication platform 230 may be non-cloud-based (i.e., may be implemented outside of a cloud computing environment) or may be partially cloud-based.

Cloud computing environment 232 includes an environment that hosts communication platform 230. Cloud computing environment 232 may provide computation, software, data access, storage, etc. services that do not require end-user knowledge of a physical location and configuration of system(s) and/or device(s) that hosts communication platform 230. As shown, cloud computing environment 232 may include a group of computing resources 234 (referred to collectively as "computing resources 234" and individually as "computing resource 234").

Computing resource 234 includes one or more personal computers, workstation computers, server devices, or other types of computation and/or communication devices. In some implementations, computing resource 234 may host communication platform 230. The cloud resources may include compute instances executing in computing resource 234, storage devices provided in computing resource 234, data transfer devices provided by computing resource 234, etc. In some implementations, computing resource 234 may communicate with other computing resources 234 via wired connections, wireless connections, or a combination of wired and wireless connections.

As further shown in FIG. 2, computing resource 234 includes a group of cloud resources, such as one or more applications ("APPs") 234-1, one or more virtual machines ("VMs") 234-2, virtualized storage ("VSs") 234-3, one or more hypervisors ("HYPs") 234-4, and/or the like.

Application 234-1 includes one or more software applications that may be provided to or accessed by user device 210. Application 234-1 may eliminate a need to install and execute the software applications on user device 210. For example, application 234-1 may include software associated with communication platform 230 and/or any other software capable of being provided via cloud computing environment 232. In some implementations, one application 234-1 may send/receive information to/from one or more other applications 234-1, via virtual machine 234-2.

Virtual machine 234-2 includes a software implementation of a machine (e.g., a computer) that executes programs like a physical machine. Virtual machine 234-2 may be either a system virtual machine or a process virtual machine, depending upon use and degree of correspondence to any real machine by virtual machine 234-2. A system virtual machine may provide a complete system platform that supports execution of a complete operating system ("OS"). A process virtual machine may execute a single program, and may support a single process. In some implementations, virtual machine 234-2 may execute on behalf of a user (e.g., a user of user device 210), and may manage infrastructure of cloud computing environment 232, such as data management, synchronization, or long-duration data transfers.

Virtualized storage 234-3 includes one or more storage systems and/or one or more devices that use virtualization techniques within the storage systems or devices of computing resource 234. In some implementations, within the context of a storage system, types of virtualizations may include block virtualization and file virtualization. Block virtualization may refer to abstraction (or separation) of logical storage from physical storage so that the storage system may be accessed without regard to physical storage or heterogeneous structure. The separation may permit administrators of the storage system flexibility in how the administrators manage storage for end users. File virtualization may eliminate dependencies between data accessed at a file level and a location where files are physically stored. This may enable optimization of storage use, server consolidation, and/or performance of non-disruptive file migrations.

Hypervisor 234-4 may provide hardware virtualization techniques that allow multiple operating systems (e.g., "guest operating systems") to execute concurrently on a host computer, such as computing resource 234. Hypervisor 234-4 may present a virtual operating platform to the guest operating systems, and may manage the execution of the guest operating systems. Multiple instances of a variety of operating systems may share virtualized hardware resources.

The number and arrangement of devices and networks shown in FIG. 2 are provided as one or more examples. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
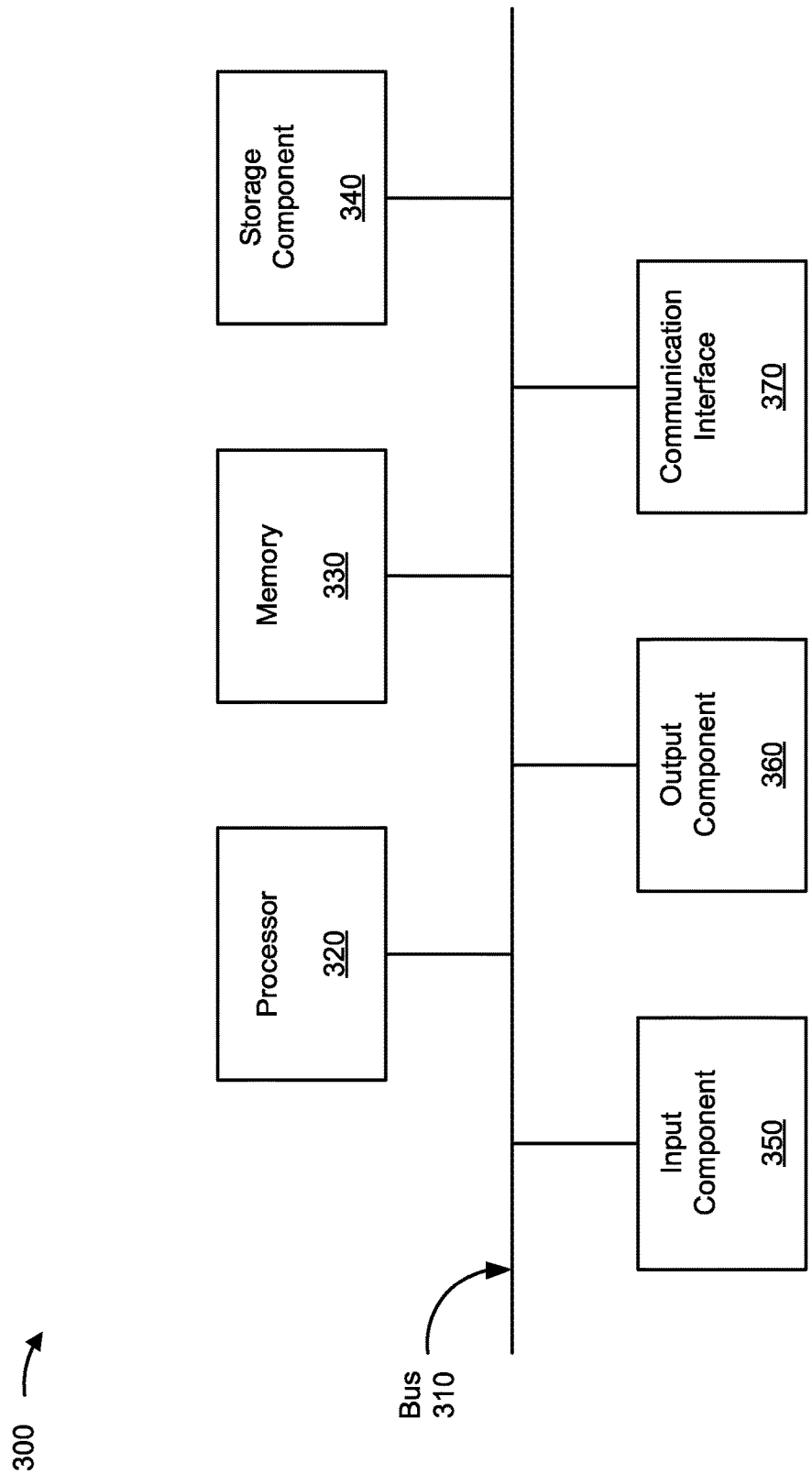
FIG. 3 is a diagram of example components of one or more devices of FIG. 2.

FIG. 3 is a diagram of example components of a device 300. Device 300 may correspond to user device 210, communication platform 230, computing resource 234, and/or the like. In some implementations, user device 210, communication platform 230, computing resource 234, and/or the like may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among multiple components of device 300. Processor 320 is implemented in hardware, firmware, and/or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a component for determining location (e.g., a global positioning system (GPS) component) and/or a sensor (e.g., an accelerometer, a gyroscope, an actuator, another type of positional or environmental sensor, and/or the like). Output component 360 includes a component that provides output information from device 300 (via, e.g., a display, a speaker, a haptic feedback component, an audio or visual indicator, and/or the like).

Communication interface 370 includes a transceiver-like component (e.g., a transceiver, a separate receiver, a separate transmitter, and/or the like) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, and/or the like.

Device 300 may perform one or more processes described herein. Device 300 may perform these processes based on processor 320 executing software instructions stored by a non-transitory computer-readable medium, such as memory 330 and/or storage component 340. As used herein, the term "computer-readable medium" refers to a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIG. 4 is a flow chart of an example process 400 for updating a speech generation setting based on user speech. In some implementations, one or more process blocks of FIG. 4 may be performed by a communication platform (e.g., communication platform 230). In some implementations, one or more process blocks of FIG. 4 may be performed by another device or a group of devices separate from or including the communication platform, such as a user device (e.g., user device 210).

As shown in FIG. 4, process 400 may include causing a communication session to be established between the device and a user device to allow the device and the user device to communicate speech (block 405). For example, the communication platform (e.g., using computing resource 234, processor 320, memory 330, storage component 340, communication interface 370, and/or the like) may cause a communication session to be established between the device and a user device to allow the device and the user device to communicate speech, as described above.

As further shown in FIG. 4, process 400 may include generating first device speech based on a speech generation rate of speech setting of the device (block 410). For example, the communication platform (e.g., using computing resource 234, processor 320, memory 330, storage component 340, communication interface 370, and/or the like) may generate first device speech based on a speech generation rate of speech setting of the device, as described above.

As further shown in FIG. 4, process 400 may include sending the first device speech to the user device (block 415). For example, the communication platform (e.g., using computing resource 234, processor 320, memory 330, storage component 340, output component 360, communication interface 370, and/or the like) may send the first device speech to the user device, as described above.

As further shown in FIG. 4, process 400 may include receiving, after sending the first device speech, first user speech from the user device (block 420). For example, the communication platform (e.g., using computing resource 234, processor 320, memory 330, storage component 340, input component 350, communication interface 370, and/or the like) may receive, after sending the first device speech, first user speech from the user device, as described above.

As further shown in FIG. 4, process 400 may include determining a rate of speech of the first user speech (block 425). For example, the communication platform (e.g., using computing resource 234, processor 320, memory 330, storage component 340, and/or the like) may determine a rate of speech of the first user speech, as described above.

As further shown in FIG. 4, process 400 may include updating the speech generation rate of speech setting to correspond to the rate of speech of the first user speech (block 430). For example, the communication platform (e.g., using computing resource 234, processor 320, memory 330, storage component 340, and/or the like) may update the speech generation rate of speech setting to correspond to the rate of speech of the first user speech, as described above.

As further shown in FIG. 4, process 400 may include generating, after updating the speech generation rate of speech setting, second device speech based on the speech generation rate of speech setting (block 435). For example, the communication platform (e.g., using computing resource 234, processor 320, memory 330, storage component 340, communication interface 370, and/or the like) may generate, after updating the speech generation rate of speech setting, second device speech based on the speech generation rate of speech setting, as described above.

As further shown in FIG. 4, process 400 may include sending the second device speech to the user device (block 440). For example, the communication platform (e.g., using computing resource 234, processor 320, memory 330, storage component 340, output component 360, communication interface 370, and/or the like) may send the second device speech to the user device, as described above.

Process 400 may include additional implementations, such as any single implementation or any combination of implementations described herein and/or in connection with one or more other processes described elsewhere herein.

In some implementations, when determining the rate of speech of the first user speech, the communication platform may process the first user speech using a natural language processing technique to determine one or more words of the first user speech, may determine a number of words of the first user speech based on the one or more words of the first user speech, may determine a length of time of the first user speech, and may determine the rate of speech of the first user speech based on the number of words of the first user speech and the length of time of the first user speech.

In some implementations, when updating the speech generation rate of speech setting to correspond to the rate of speech of the first user speech, the communication platform may determine, using a machine learning model, a relationship between a speech generation rate of speech setting and a rate of speech of user speech, and may update the speech generation rate of speech setting to correspond to the rate of speech of the first user speech based on the relationship. In some implementations, a rate of speech of the second device speech may be different than a rate of speech of the first device speech.

In some implementations, when generating the second device speech based on the speech generation rate of speech setting, the communication platform may process the first user speech using a natural language processing technique to determine first user speech content, may determine, based on the first user speech content, second device speech content, and may generate, based on the second device speech content, the second device speech using a text-to-speech technique that utilizes the speech generation rate of speech setting.

In some implementations, when causing the communication session to be established between the device and the user device to allow the device and the user device to communicate speech, the communication platform may receive a communication request from the user device, may generate a communication response based on the communication request, and may send the communication response to a different device to cause the different device to establish the communication session between the device and the user device.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

FIG. 5 is a flow chart of an example process 500 for updating a speech generation setting based on user speech. In some implementations, one or more process blocks of FIG. 5 may be performed by a communication platform (e.g., communication platform 230). In some implementations, one or more process blocks of FIG. 5 may be performed by another device or a group of devices separate from or including the communication platform, such as a user device (e.g., user device 210).

As shown in FIG. 5, process 500 may include generating first device speech based on one or more speech generation settings (block 505). For example, the communication platform (e.g., using computing resource 234, processor 320, memory 330, storage component 340, communication interface 370, and/or the like) may generate first device speech based on one or more speech generation settings, as described above.

As further shown in FIG. 5, process 500 may include sending the first device speech to a user device (block 510). For example, the communication platform (e.g., using computing resource 234, processor 320, memory 330, storage component 340, output component 360, communication interface 370, and/or the like) may send the first device speech to a user device, as described above.

As further shown in FIG. 5, process 500 may include receiving, after sending the first device speech, first user speech from the user device (block 515). For example, the communication platform (e.g., using computing resource 234, processor 320, memory 330, storage component 340, input component 350, communication interface 370, and/or the like) may receive, after sending the first device speech, first user speech from the user device, as described above.

As further shown in FIG. 5, process 500 may include determining one or more characteristics of the first user speech (block 520). For example, the communication platform (e.g., using computing resource 234, processor 320, memory 330, storage component 340, and/or the like) may determine one or more characteristics of the first user speech, as described above.

As further shown in FIG. 5, process 500 may include updating a first set of speech generation settings of the one or more speech generation settings based on the one or more characteristics of the first user speech (block 525). For example, the communication platform (e.g., using computing resource 234, processor 320, memory 330, storage component 340, and/or the like) may update a first set of speech generation settings of the one or more speech generation settings based on the one or more characteristics of the first user speech, as described above.

As further shown in FIG. 5, process 500 may include generating, after updating the first set of speech generation settings of the one or more speech generation settings based on the one or more characteristics of the first user speech, second device speech based on the updated first set of speech generation settings of the one or more speech generation settings, wherein at least one characteristic of the second device speech is different from at least one characteristic of the first device speech (block 530). For example, the communication platform (e.g., using computing resource 234, processor 320, memory 330, storage component 340, communication interface 370, and/or the like) may generate, after updating the first set of speech generation settings of the one or more speech generation settings based on the one or more characteristics of the first user speech, second device speech based on the updated first set of speech generation settings of the one or more speech generation settings, as described above. In some implementations, at least one characteristic of the second device speech may be different from at least one characteristic of the first device speech.

As further shown in FIG. 5, process 500 may include sending the second device speech to the user device (block 535). For example, the communication platform (e.g., using computing resource 234, processor 320, memory 330, storage component 340, output component 360, communication interface 370, and/or the like) may send the second device speech to the user device, as described above.

Process 500 may include additional implementations, such as any single implementation or any combination of implementations described below and/or in connection with one or more other processes described elsewhere herein.

In some implementations, the communication platform may receive, after sending the second device speech, second user speech from the user device, may determine one or more characteristics of the second user speech, and may update the first set of speech generation settings or a second set of speech generation settings of the one or more speech generation settings based on the one or more characteristics of the second user speech. Additionally, the communication platform may generate, after updating the first set of speech generation settings or the second set of speech generation settings of the one or more speech generation settings based on the one or more characteristics of the second user speech, third device speech based on the updated first set of speech generation settings or second set of speech generation settings of the one or more speech generation settings, where at least one characteristic of the third device speech is different from the at least one characteristic of the second device speech, and may send the third device speech to the user device.

In some implementations, the one or more characteristics of the first user speech may include at least one of: a rate of speech of the first user speech, a cadence of the first user speech, a loudness of the first user speech, a timbre of the first user speech, a language associated with the first user speech, a dialect associated with the first user speech, an accent associated with the first user speech, or a grammar associated with the first user speech.

In some implementations, the one or more speech generation settings may include at least one of: a speech generation rate of speech setting, a speech generation cadence setting, a speech generation loudness setting, a speech generation timbre setting, a speech generation language setting, a speech generation dialect setting, a speech generation accent setting, or a speech generation grammar setting.

In some implementations, when determining the one or more characteristics of the first user speech, the communication platform may determine a number of syllables of the first user speech, may determine a length of time of the first user speech, and may determine a rate of speech of the first user speech based on the number of syllables of the first user speech and the length of time of the first user speech.

In some implementations, when determining the one or more characteristics of the first user speech, the communication platform may process the first user speech to remove filler words, may determine, after removing the filler words, a number of words of the first user speech, may determine, after removing the filler words, a length of time of the first user speech, and may determine a rate of speech of the first user speech based on the number of words of the first user speech and the length of time of the first user speech.

In some implementations, a characteristic of the one or more characteristics of the first user speech may be a language associated with the first user speech, and, when updating the first set of speech generation settings of the one or more speech generation settings based on the one or more characteristics of the first user speech, the communication platform may determine a speech generation language setting of the one or more speech generation settings, and may update the speech generation language setting to correspond to the language associated with the first user speech.

In some implementations, a characteristic of the one or more characteristics of the first user speech may be an accent associated with the first user speech, where updating the first set of speech generation settings of the one or more speech generation settings based on the one or more characteristics of the first user speech comprises: determining a speech generation accent setting of the one or more speech generation settings, and updating the speech generation accent setting to correspond to the accent associated with the first user speech.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIG. 6 is a flow chart of an example process 600 for updating a speech generation setting based on user speech. In some implementations, one or more process blocks of FIG. 6 may be performed by a communication platform (e.g., communication platform 230). In some implementations, one or more process blocks of FIG. 6 may be performed by another device or a group of devices separate from or including the communication platform, such as a user device (e.g., user device 210).

As shown in FIG. 6, process 600 may include causing a communication session to be established between the device and a user device to allow the device and the user device to communicate speech (block 605). For example, the communication platform (e.g., using computing resource 234, processor 320, memory 330, storage component 340, communication interface 370, and/or the like) may cause a communication session to be established between the device and a user device to allow the device and the user device to communicate speech, as described above.

As further shown in FIG. 6, process 600 may include receiving user speech from the user device (block 610). For example, the communication platform (e.g., using computing resource 234, processor 320, memory 330, storage component 340, input component 350, communication interface 370, and/or the like) may receive user speech from the user device, as described above.

As further shown in FIG. 6, process 600 may include processing the user speech using a natural language processing technique to determine a plurality of characteristics of the user speech (block 615). For example, the communication platform (e.g., using computing resource 234, processor 320, memory 330, storage component 340, and/or the like) may process the user speech using a natural language processing technique to determine a plurality of characteristics of the user speech, as described above.

As further shown in FIG. 6, process 600 may include updating a speech generation setting of a plurality of speech generation settings based on the plurality of characteristics of the user speech (block 620). For example, the communication platform (e.g., using computing resource 234, processor 320, memory 330, storage component 340, and/or the like) may update a speech generation setting of a plurality of speech generation settings based on the plurality of characteristics of the user speech, as described above.

As further shown in FIG. 6, process 600 may include generating, after updating the speech generation setting, device speech using a text-to-speech technique based on the speech generation setting (block 625). For example, the communication platform (e.g., using computing resource 234, processor 320, memory 330, storage component 340, and/or the like) may generate, after updating the speech generation setting, device speech using a text-to-speech technique based on the speech generation setting, as described above.

As further shown in FIG. 6, process 600 may include sending the device speech to the user device (block 630). For example, the communication platform (e.g., using computing resource 234, processor 320, memory 330, storage component 340, output component 360, communication interface 370, and/or the like) may send the device speech to the user device, as described above.

Process 600 may include additional implementations, such as any single implementation or any combination of implementations described below and/or in connection with one or more other processes described elsewhere herein.

In some implementations, a characteristic of the plurality of characteristics of the user speech may be a cadence of the user speech, and, when updating the speech generation setting of the plurality of speech generation settings based on the plurality of characteristics of the user speech, the communication platform may determine a speech generation cadence setting of the plurality of speech generation settings, and may update the speech generation cadence setting to correspond to the cadence of the user speech.

In some implementations, a characteristic of the plurality of characteristics of the user speech may be a grammar associated with the user speech, and, when updating the speech generation setting of the plurality of speech generation settings based on the plurality of characteristics of the user speech, the communication platform may determine a speech generation grammar setting of the plurality of speech generation settings, and may update the speech generation grammar setting to match the grammar associated with the user speech.

In some implementations, when generating the device speech using the text-to-speech technique based on the speech generation setting, the communication platform may generate, based on the user speech, device speech content, and may generate, based on the device speech content, the device speech using a speech generation technique, where the speech generation technique uses the speech generation setting to generate the device speech.

In some implementations, the speech generation setting may be a speech generation rate of speech setting, and, when generating the device speech using the text-to-speech technique based on the speech generation setting, the communication platform may generate device speech content based on the user speech, and may generate, based on the device speech content, the device speech, where a rate of speech of the device speech corresponds to the speech generation rate of speech setting.

In some implementations, the speech generation setting may be a speech generation dialect setting, and, when generating the device speech using the text-to-speech technique based on the speech generation setting, the communication platform may generate device speech content based on the user speech, and may generate, based on the device speech content, the device speech, where a dialect of the device speech corresponds to the speech generation dialect setting.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations.

As used herein, the term "component" is intended to be broadly construed as hardware, firmware, or a combination of hardware and software.

Certain user interfaces have been described herein and/or shown in the figures. A user interface may include a graphical user interface, a non-graphical user interface, a text-based user interface, and/or the like. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
one or more memories; and
one or more processors, communicatively coupled to the one or more memories, configured to:
cause a communication session to be established between the device and a user device to allow the device and the user device to communicate speech;
receive user speech from the user device;
determine a speech characteristic of the user speech based on applying a natural language processing technique to the user speech,
wherein the speech characteristic includes at least one of:
a cadence of the user speech, or
a timbre of the user speech;
set a device characteristic of device speech based on the speech characteristic of the user speech determined using the natural language processing technique;
wherein the one or more processors, when setting the device characteristic, are to:
match the device characteristic to the speech characteristic of the user speech within a threshold amount;
generate the device speech based on the device characteristic; and
send the device speech to the user device.

2. The device of claim 1, wherein the one or more processors, when setting the device characteristic, are to:
determine, using a trained machine learning model, a relationship between the speech characteristic and the device characteristic, and set the device characteristic to match the speech characteristic based on the relationship.

3. The device of claim 2, wherein the one or more processors are further to:
obtain historical data associated with speech generation settings and characteristics of user speech;
preprocess the historical data to remove:
filler words,
pauses,
background noise, or
confidential data; and
train a machine learning model to generate the trained machine learning model based on the preprocessed historical data.

4. The device of claim 1, wherein the speech characteristic includes a rate of speech of the user speech and the device characteristic includes a rate of speech of the device speech.

5. The device of claim 1, wherein the speech characteristic includes the cadence of the user speech and the device characteristic includes a cadence of the device speech.

6. The device of claim 1, wherein the speech characteristic includes a loudness of the user speech and the device characteristic includes a loudness of the device speech.

7. The device of claim 1, wherein the speech characteristic includes the timbre of the user speech and the device characteristic includes a timbre of the device speech.

8. A method, comprising:
causing, by a device, a communication session to be established between the device and a user device to allow the device and the user device to communicate speech;
receiving, by the device, user speech from the user device;
determining, by the device, a speech characteristic of the user speech based on applying a natural language processing technique to the user speech,
wherein the speech characteristic includes at least one of:
a cadence of the user speech, or
a timbre of the user speech; and
setting, by the device, a device characteristic of device speech based on the speech characteristic of the user speech determined using the natural language processing technique;
wherein setting the device characteristic includes:
matching the device characteristic to the speech characteristic of the user speech within a threshold amount;
generating, by the device, the device speech based on the device characteristic; and
sending, by the device, the device speech to the user device.

9. The method of claim 8, wherein setting the device characteristic includes:
determining, using a trained machine learning model, a relationship between the speech characteristic and the device characteristic, and
setting the device characteristic to match the speech characteristic based on the relationship.

10. The method of claim 9, further comprising:
obtaining historical data associated with speech generation settings and characteristics of user speech;
preprocessing the historical data to remove:
filler words,
pauses,
background noise, or
confidential data; and
training a machine learning model to generate the trained machine learning model based on the preprocessed historical data.

11. The method of claim 8, wherein the speech characteristic includes a rate of speech of the user speech and the device characteristic includes a rate of speech of the device speech.

12. The method of claim 8, wherein the speech characteristic includes the cadence of the user speech and the device characteristic includes a cadence of the device speech.

13. The method of claim 8, wherein the speech characteristic includes a loudness of the user speech and the device characteristic includes a loudness of the device speech.

14. The method of claim 8, wherein the speech characteristic includes the timbre of the user speech and the device characteristic includes a timbre of the device speech.

15. A non-transitory computer-readable medium storing instructions, the instructions comprising:
one or more instructions that, when executed by one or more processors of a device, cause the one or more processors to:
cause a communication session to be established between the device and a user device to allow the device and the user device to communicate speech;
receive user speech from the user device;
determine a speech characteristic of the user speech based on applying a natural language processing technique to the user speech,
wherein the speech characteristic includes at least one of:
a cadence of the user speech, or
a timbre of the user speech; and
set a device characteristic of device speech based on the speech characteristic of the user speech determined using the natural language processing technique;
wherein the one or more instructions, when executed by the one or more processors to set the device characteristic, further cause the one or more processors to:
match the device characteristic to the speech characteristic of the user speech within a threshold amount;
generate the device speech based on the device characteristic; and
send the device speech to the user device.

16. The non-transitory computer-readable medium of claim 15, wherein the one or more instructions, when executed by the one or more processors to set the device characteristic, further cause the one or more processors to:
determine, using a trained machine learning model, a relationship between the speech characteristic and the device characteristic, and
set the device characteristic to match the speech characteristic based on the relationship.

17. The non-transitory computer-readable medium of claim 16, wherein the one or more instructions, when executed by the one or more processors, further cause the one or more processors to:
obtain historical data associated with speech generation settings and characteristics of user speech;
preprocess the historical data to remove:
filler words,
pauses,
background noise, or
confidential data; and train a machine learning model to generate the trained machine learning model based on the preprocessed historical data.

18. The non-transitory computer-readable medium of claim 15, wherein the speech characteristic includes a rate of speech of the user speech and the device characteristic includes a rate of speech of the device speech.

19. The non-transitory computer-readable medium of claim 15, wherein the speech characteristic includes the cadence of the user speech and the device characteristic includes a cadence of the device speech.

20. The non-transitory computer-readable medium of claim 15, wherein the speech characteristic includes a loudness of the user speech and the device characteristic includes a loudness of the device speech.

* * * * *